United States Patent [19]
Zorabedian

[11] Patent Number: 6,108,355
[45] Date of Patent: Aug. 22, 2000

[54] CONTINUOUSLY-TUNABLE EXTERNAL CAVITY LASER

[75] Inventor: Paul Zorabedian, Mountain View, Calif.

[73] Assignee: New Focus, Inc., Santa Clara, Calif.

[21] Appl. No.: 09/342,342

[22] Filed: Jun. 29, 1999

Related U.S. Application Data

[60] Provisional application No. 60/104,448, Oct. 16, 1998.

[51] Int. Cl.$^7$ ....................................................... H01S 3/10
[52] U.S. Cl. ............................. 372/20; 372/107; 372/19; 372/99; 372/92
[58] Field of Search ............................... 372/20, 107, 99, 372/19, 100, 92, 101; 356/349

[56] References Cited

U.S. PATENT DOCUMENTS

| | | | |
|---|---|---|---|
| 5,130,457 | 4/1992 | Wallace et al. . | |
| 5,319,668 | 6/1994 | Luecke . | |
| 5,321,717 | 6/1994 | Adachi et al. | 372/100 |
| 5,412,474 | 5/1995 | Reasenberg et al. | 356/349 |
| 5,596,456 | 1/1997 | Luecke . | |
| 5,838,713 | 11/1998 | Shimoji | 372/92 |
| 5,867,512 | 2/1999 | Sacher | 372/20 |

OTHER PUBLICATIONS

Zorabedian et al., "Interference–filter–tuned, alignment–stabilized, semiconductor external–cavity laser", Reprinted from Optics Letters, vol. 13, p. 826, Oct. 1988.

Zhang et al., "An Interference Filter Based External Cavity Laser For Dense Wavelength Division Multiplexing Applications", Technical Proceedings, vol. 1, National Fiber Optics Engineers Conference, Sep. 13–17, 1998.

*Primary Examiner*—Leon Scott, Jr.
*Attorney, Agent, or Firm*—Beyer Weaver Thomas & Nguyen LLP; Charles C. Cary

[57] ABSTRACT

The present invention provides an external cavity laser that has wide-range continuous tuning and is compatible with a compact, robust, inexpensive form factor. In an embodiment of the invention a tunable external cavity laser is disclosed. The laser includes a laser amplifier, a retroreflector, a first and second reflector and a translator. The retroreflector is located in a path of the beam provided by the laser amplifier. The first and second reflectors are positioned opposite one another and in the path of the beam between the laser amplifier and the retroreflector. The translator translates at least one of said first reflector and said second reflector to vary the separation between the reflectors along the path of the beam, thereby tuning the laser amplifier. In another embodiment of the invention a method for adjusting wavelength in an optical device is disclosed. The method comprises the act of translating at least one of the first and the second reflective surfaces to vary a separation between the reflectors along the path of a beam emitted by the laser amplifier to tune the laser.

20 Claims, 8 Drawing Sheets

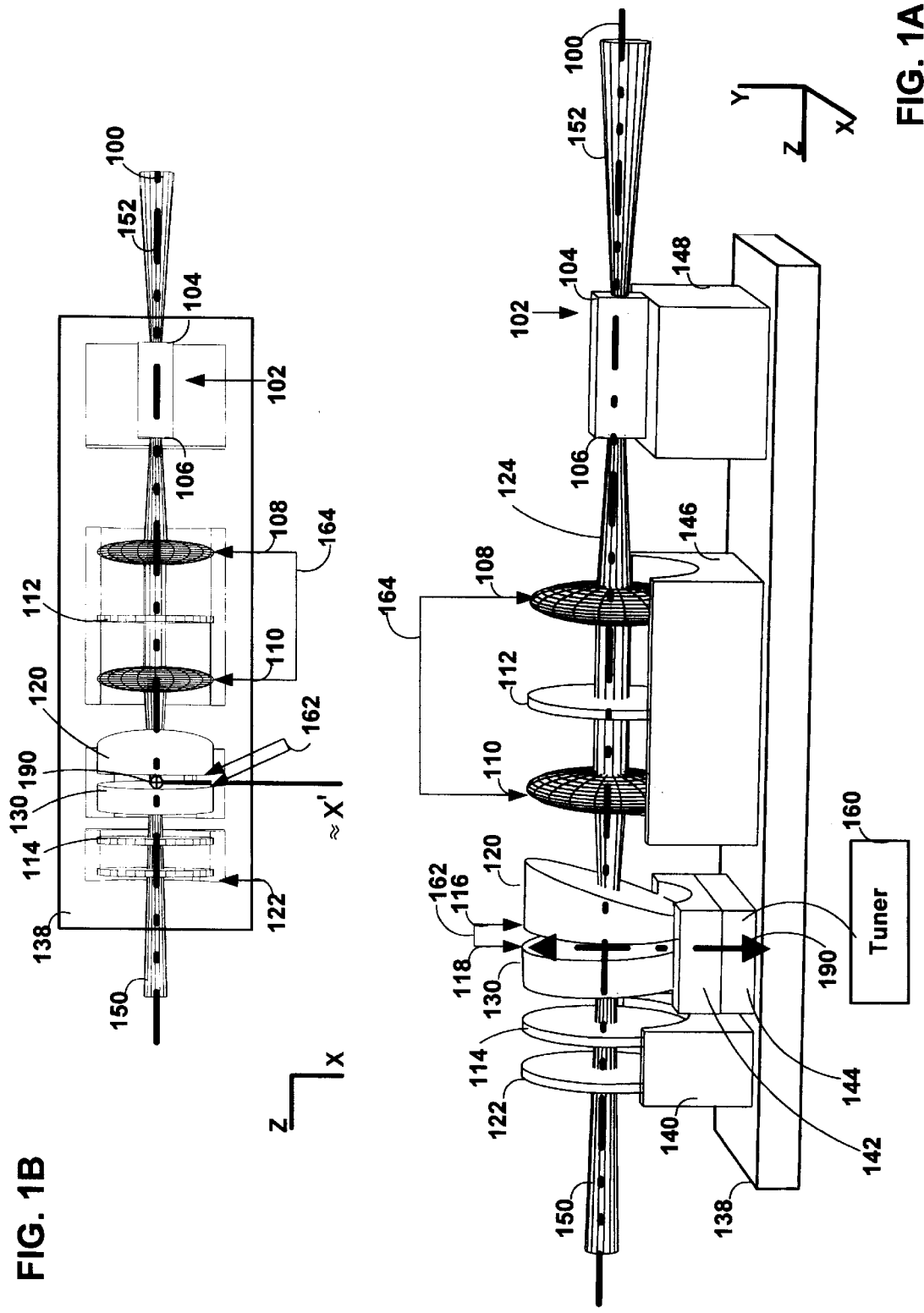

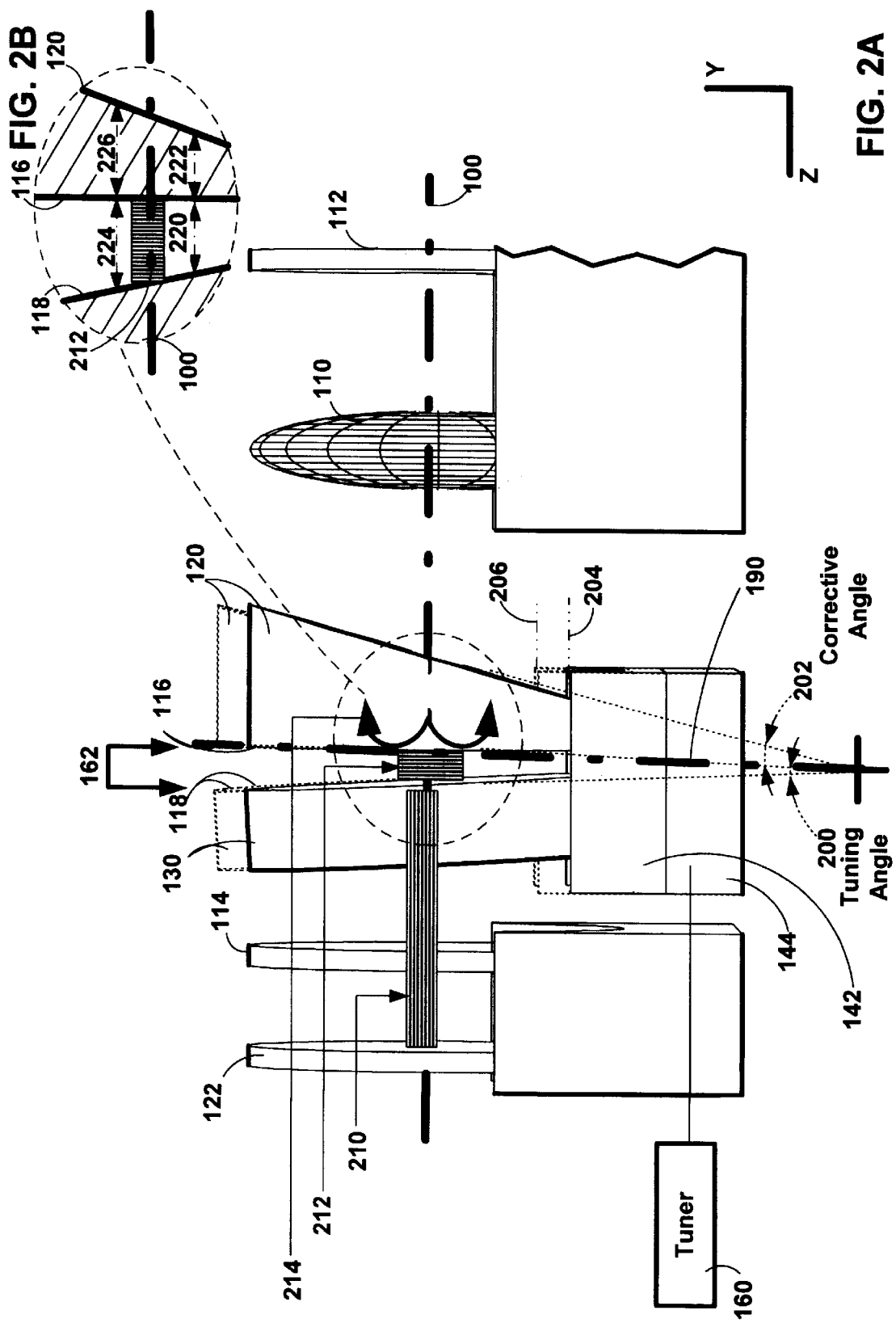

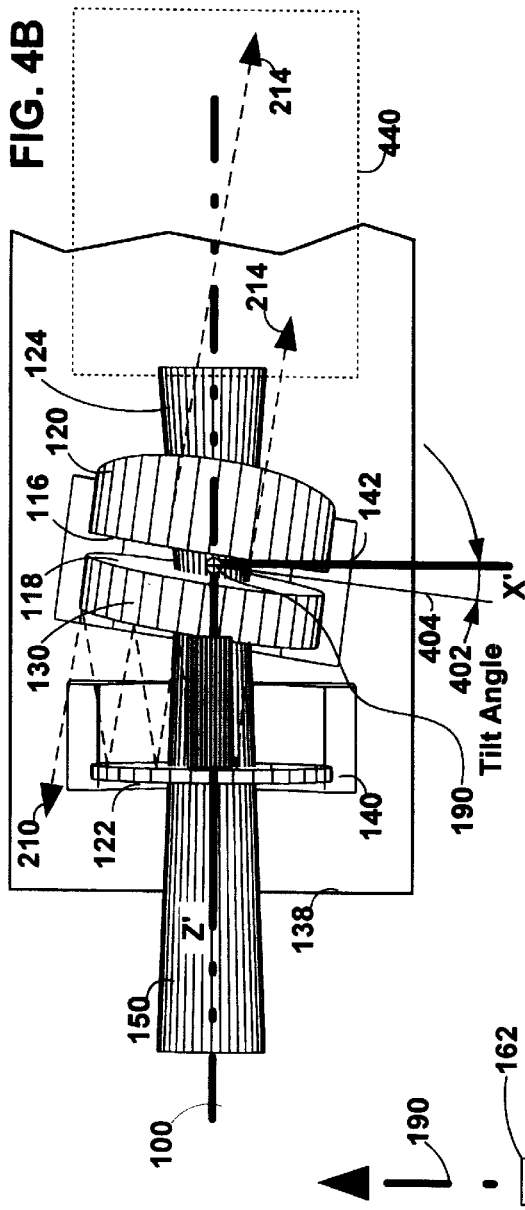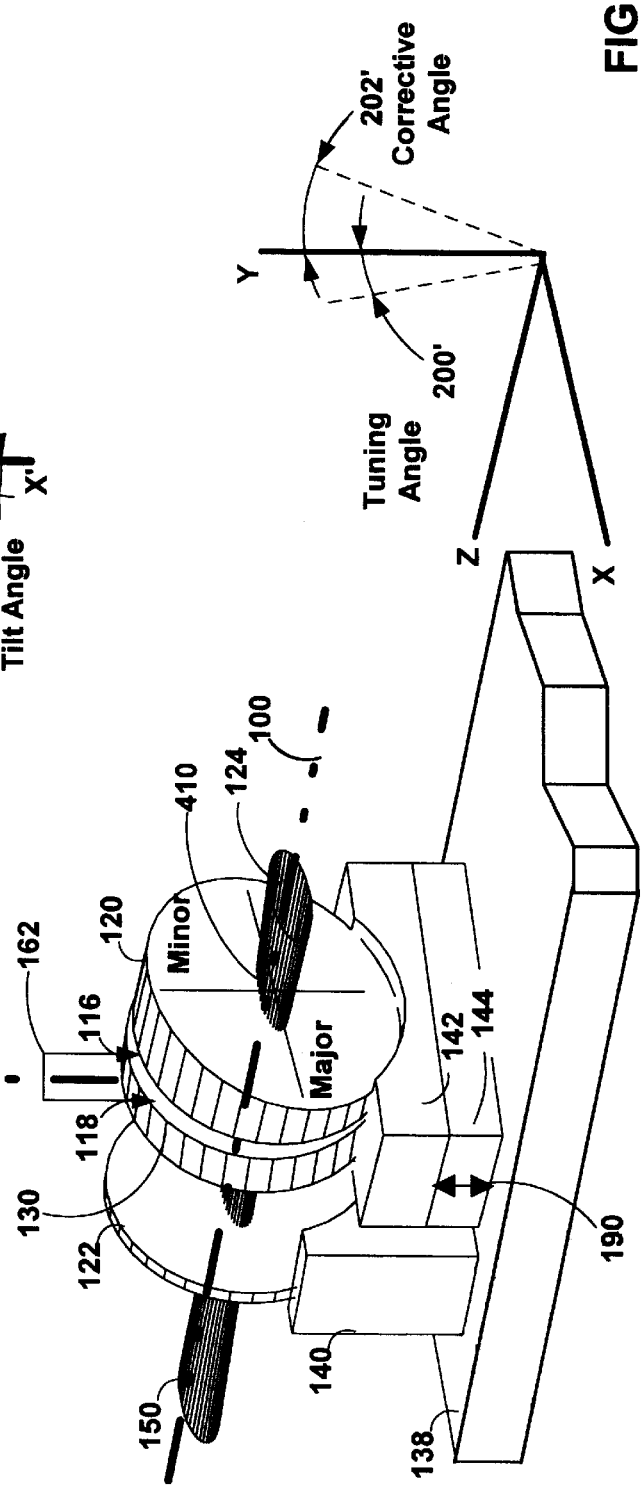

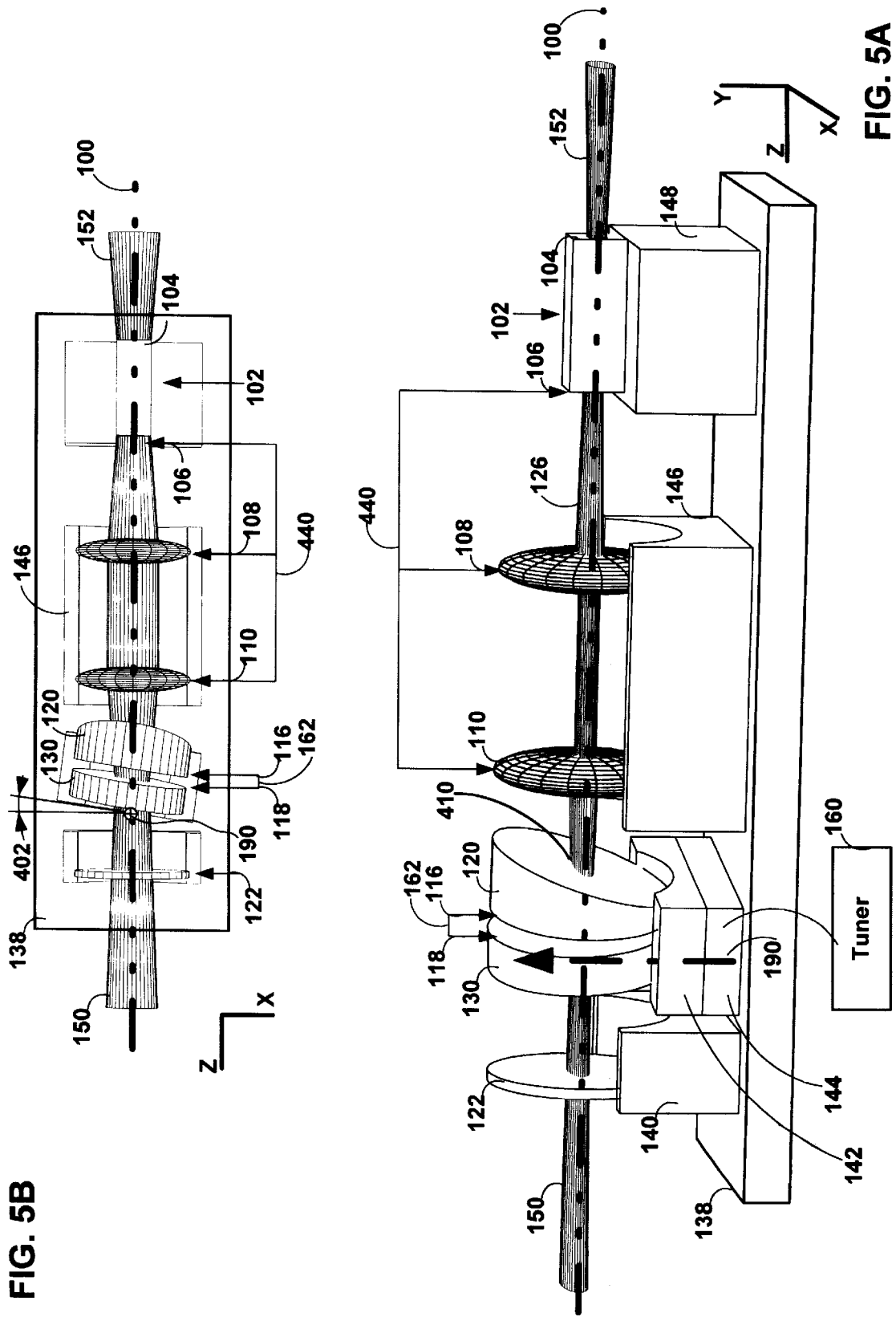

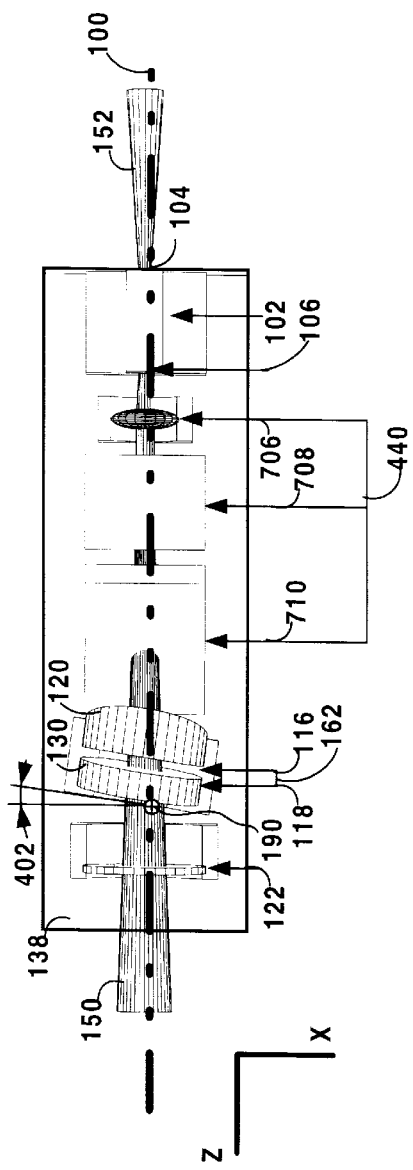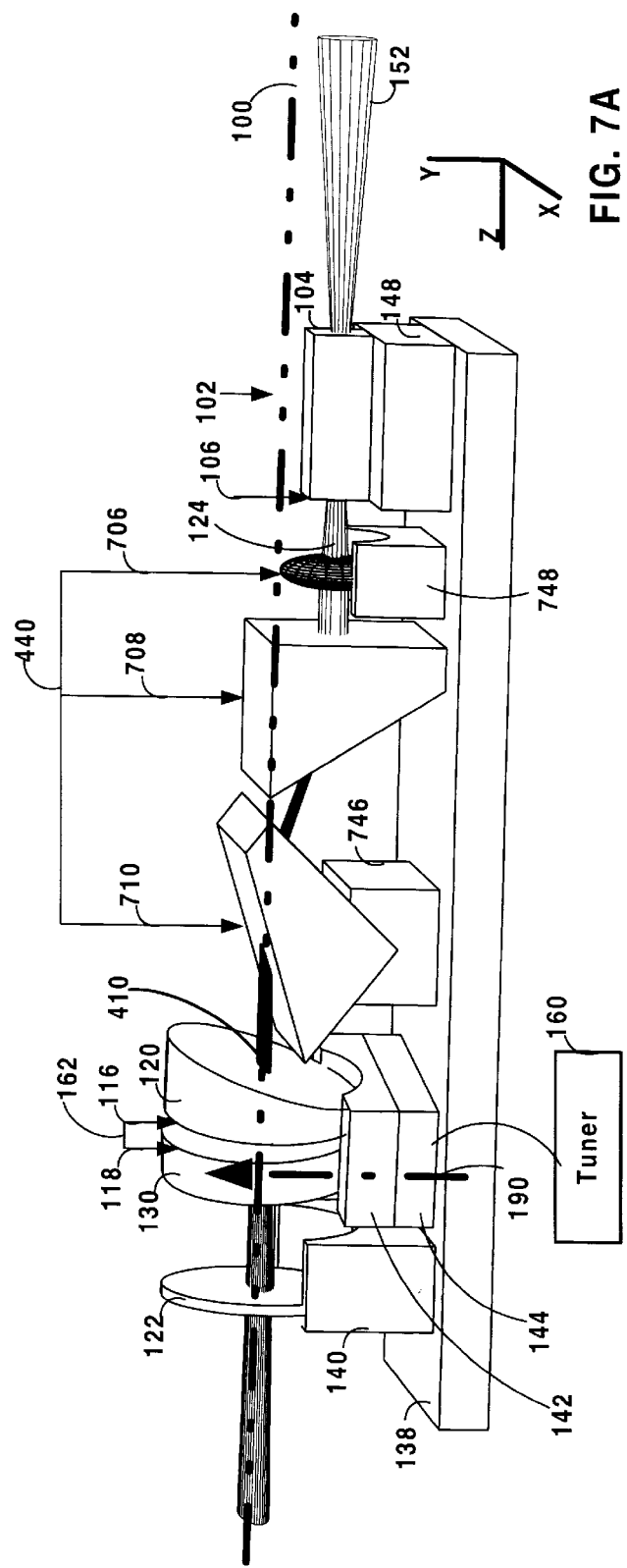

CONTINUOUSLY-TUNABLE EXTERNAL CAVITY LASER

This application claims benefit of priority under 35 U.S.C. §119(e) of U.S. Provisional Application No. 60/104,448, filed Oct. 16, 1998, entitled "CONTINUOUSLY-TUNABLE, INTERFERENCE-FILTER-BASED EXTERNAL CAVITY DIODE LASER" which is hereby incorporated by reference in its entirety.

BACKGROUND OF THE INVENTION

Copyright Authorization

A portion of the disclosure of this patent document contains material which is subject to copyright protection. The copyright owner has no objection to the facsimile reproduction by anyone of the patent disclosure, as it appears in the U.S. Patent and Trademark Office patent files or records, but otherwise reserves all copyright rights whatsoever.

1. Field of Invention

The field of the present invention relates in general to tunable external cavity lasers, and particularly to an improved tuning system which suppresses mode-hopping and reduces unwanted feedback.

2. Description of the Related Art

Wavelength division multiplexed optical communications systems require compact optical sources which can be tuned to specific channel wavelengths. Prior art is the distributed feedback laser (DFB). Producing a DFB laser for a specific wavelength is a low-yield, statistical process. DFB's are tunable over a few nanometers, but a single DFB cannot be tuned to all of the wavelengths in the communications band (roughly 50–100 nm wide). External cavity semiconductor lasers, on the other hand, can be widely tuned to cover the entire band with a single unit. The common grating-based designs, however, are too large and delicate to be used as installed sources in WDM systems. What is needed is a new type of external cavity laser that has wide-range continuous tuning and possesses a compact, robust, inexpensive form factor.

SUMMARY OF THE INVENTION

The present invention provides an external cavity laser that has wide-range continuous tuning and possesses a compact, robust, inexpensive form factor.

In an embodiment of the invention a tunable external cavity laser is disclosed. The laser includes an optical gain medium, a retroreflector, a first and second reflector and a translator. The gain medium emits a beam. The retroreflector is located in a path of the beam. The first and second reflectors are positioned opposite one another and in the path of the beam between the laser amplifier and the retroreflector. The translator translates at least one of said first reflector and said second reflector to vary a separation between the reflectors along the path of the beam, thereby tuning the laser amplifier.

In another embodiment of the invention a method for adjusting wavelength in an optical device including a laser amplifier, a retroreflector and an etalon is provided. The etalon includes a first and a second reflective surface. The method of adjusting the wavelength comprising the act of:

translating at least one of the first and the second reflective surfaces to vary a separation between the reflectors along the path of a beam emitted by the laser amplifier thereby varying a wavelength at which constructive interference between the reflective surfaces takes place.

BRIEF DESCRIPTION OF THE DRAWINGS

These and other features and advantages of the present invention will become more apparent to those skilled in the art from the following detailed description in conjunction with the appended drawings in which:

FIGS. 1A–1B are respectively isometric and top views of a tunable external cavity laser according to the current invention.

FIG. 2A is an exploded side view of the etalon and corrective elements shown in FIGS. 1A–B.

FIGS. 2B–2E show alternate embodiments for the etalon and corrective elements shown in FIG. 2A.

FIGS. 4A–4B are respectively isometric and top views of an alternate embodiment of the etalon and corrective elements in which both spurious interference and reflections are suppressed.

FIGS. 5A–5B are respectively detailed isometric and top views of an external cavity diode laser incorporating an embodiment of a lens system suitable for use with the novel etalon and corrective elements shown in FIGS. 4A–B.

FIGS. 7A–7B are respectively detailed isometric and top views of an external cavity diode laser incorporating still another embodiment of a lens system suitable for use with the novel etalon and corrective elements shown in FIGS. 4A–B.

DETAILED DESCRIPTION OF THE EMBODIMENTS

Figure 2C:
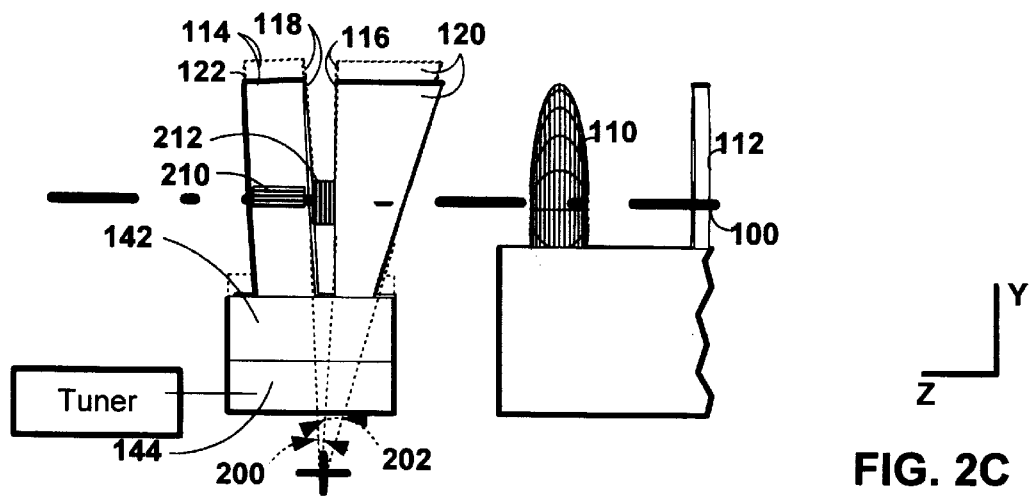

The continuously-tunable external cavity laser of the current invention provides the advantages of a compact form factor, precise tuning, an absence of mode-hopping and reduced feedback from both spurious interference and reflections in the external cavity.

In various embodiments of the invention, a "degenerate resonator" type of cavity configuration is utilized. This configuration is very tolerant to various angular and lateral misalignments to which the laser may be subjected. This property makes it easy to assemble and gives the laser robust tolerances to environmental fluctuations in transport, storage, and service. The principles of degenerate resonators are well-known and taught in references, e.g., J. A. Arnaud, *Beam and Fiber Optics*, New York Academic Press 1976 and P. Zorabedian, *Interference-filter-tuned, Alignment Stabilized External Cavity Laser*, Optical Letters Volume 13, 1988, which is incorporated by reference as if fully set forth herein.

FIGS. 1–2 and 4–7 are shown with reference to a three axis X, Y, Z coordinate system. The optical components of all embodiments except that shown in FIGS. 7A–B are laid out along an optical axis 100, which is itself parallel with the "Z" axis.

FIGS. 1A–B are respectively isometric and top views of an embodiment of the external cavity laser according to the current invention. The laser external cavity is delimited by the partially reflecting rear facet 104 of the gain medium/ laser amplifier 102 and by an external retroreflector 122. Tunable feedback to control the lasing wavelength is provided by the external cavity which is optically coupled to the anti-reflection (AR) side of the gain medium. The effective reflectivity of the external cavity should be much greater than the residual reflectivity of the AR coated front facet 106 so that the tuning element, i.e., an interference filter/etalon can deliver sufficient feedback to put the laser in the "strong feedback" regime.

The external cavity laser includes a laser amplifier 102, a lens system 164, quarter-wave plates/optical retarders 112–114, an interference filter/etalon 162, a corrective element 120, a translator 144, a tuner 160, a retroreflector 122, a base 138, and mounting blocks 140–142, 146–148. The laser amplifier 102 in the embodiment shown is a laser diode with a rear and front facet, respectively 104–106. The lens system includes collimating/focusing lenses 108–110. The etalon includes first and second reflectors, 116–118.

Structurally, the tunable laser is shown laid out along a longitudinal axis 100. The laser amplifier, in an embodiment of the invention, is a conventional Fabry-Perot laser diode with a partially reflecting dielectric coating on the rear facet and an AR coating on the front facet. The front and rear facets 106–104 of the laser diode are aligned with longitudinal axis 100. The laser diode is coupled to the base 138 via mounting block 148. The proximal end of the external cavity is located at the front facet 106 of the laser diode. The distal end of the external cavity is defined by the retroreflector 122. The retroreflector is affixed to the base via mount 140. The collimating/focusing lens pair 108–110 is mounted coaxially with the optical axis 100 proximate the front facet 106. These lenses collimate and focus ray 124 from the laser diode 102. The collimating and focusing lenses are affixed to the base 138 via mount 146. The quarter-wave plate/optical retarder 112 is positioned coaxially with and between the collimating and focusing lenses. It also is affixed to the base via mount 146. The second of the optical retarders 114 lies within the external cavity adjacent the distal end thereof and proximate to the retroreflector 122. It also is affixed to the base 138 via mounting block 140 which it shares with the retroreflector. The etalon 162 may be either gas-spaced or solid type. In the embodiment shown, the etalon is of a gas-spaced/air-gap type. The etalon defined by the opposing planar first and second reflectors 116–118 is a wedge-shaped air-gap. The reflectors are adhered to the inward facing surfaces of, respectively, a transmissive substrate 130 and the corrective element 120. In an embodiment of the invention, the reflectors may be formed by dielectrically coating the interior faces of the transmissive substrate 130 and the corrective element 120 with a highly reflecting, i.e., R>90% dielectric layer. The substrate and corrective element are in turn coupled via mount 142 and translator 144 to the base 138.

In operation, the embodiment shown in FIGS. 1A–B allows both tuning of the wavelength in the external cavity and adjustment of the cavity length to avoid mode-hopping.

In FIG. 1A, a beam 124 is shown emanating from the front facet 106 of the laser amplifier 102. In an embodiment, the laser amplifier comprises a laser diode which preferentially amplifies linearly polarized light of a certain orientation. The beam is collimated by lens 108, subject to a change in polarization from linear to circular by quarter-wave plate 112 and focused by lens 110. The beam is focused by lens 110 so that the waist portion of the beam, i.e., the portion in which wave fronts are substantially planar, lies within the air-gap portion of etalon 162. The filtered beam passes through the transmissive substrate 130 and a second of the quarter-wave plates 114 to the retroreflector 122. Either or both the retroreflector 122 and the back facet 104 may be fully or partially reflective. In the embodiment shown, output beams 150–152 are shown passing through, respectively, the partially reflective retroreflector 122 and the partially reflective back facet 104 of the diode 102.

The tuning of the cavity is accomplished by translation of the wedge-shaped etalon 162 across the path of the beam 124. In the embodiment shown in FIG. 1, the translation of the etalon 162 is brought about by the translator 144 translating the etalon along translation axis 190. As the etalon translates along the translation axis 190, the laser beam intersects progressively narrower portions of the wedge-shaped air-gap thereby tuning for progressively shorter wavelengths at which to tune the cavity.

The required range of motion of the translator 144 along the translation axis 190 may be in the centimeter range in practice. A variety of compact motor technologies might be used to generate this displacement, e.g., thermomechanical, ultra-sonic motor, linear stepper, etc. In an embodiment of the invention, the translator 144 operates under the control of a tuner 160. The tuner may operate with or without a wavelength feedback element to select specific wavelengths at which to tune the cavity.

Etalon 162 has repeating loss characteristics called "orders". With interference filters/etalons, the orders are closely spaced. The filter/etalon can tune the laser away from a gain peak by ±½·FSR where FSR is the free spectral range or frequency separation of peaks. Thus, for example, for a tuning range of 100 nm$^2$, the free spectral range must be on the order of 12,500 GigaHertz at a wavelength of 1.55 μm. Further teachings on etalon loss characteristics are set forth in Hecht, *Optics* 3rd Edition, Addison Wesley, 1998 Ch. 9, which is incorporated by reference as if fully set forth herein.

As the laser is tuned, mode-hopping will occur unless the integer number of half-wavelengths in the external cavity is maintained constant. In order to accomplish this latter objective a corrective element 120 is provided. In the embodiment shown the corrective element is fabricated from a optically transmissive material with a uniform index of refraction. This corrective element has a wedge-shaped cross-section in the Y-Z plane. The exterior face of the corrective element 120 which faces the laser amplifier 102 may be AR coated.

By translating the corrective element 120 to vary the path length of the cavity in synchronization with the filtered wavelength of the etalon 162, a constant mode number is maintained in the external cavity while tuning the laser. The constant mode number results from the fact that during translation as the etalon gap widens, thereby tuning for longer wavelengths, the thickness of the corrective element increases. Since the index of refraction of the correction element is greater than that of the air, the overall average index of refraction in the external cavity is increased, this reducing the propagation speed of the beam and effectively lengthening the optical path length of the cavity.

Thus, by cascading the corrective element 120, e.g., glass wedge, with the wedged interference filter/etalon 162 to vary the path length of the cavity in synchronism with the filtered wavelength, a constant mode number is maintained in the cavity during the tuning of the laser.

FIG. 2A is a side-view of the wedge-shaped air-gap etalon and corrective element portion of the tunable external cavity laser shown in FIGS. 1A–B. FIG. 2B is an exploded side cross-sectional view of the air-gap and corrective element portion of the tunable laser. The etalon 162 and corrective element 120 are sandwiched between, on a proximal side, the focusing lens 110 and quarter-wave plate 112 and on a distal side, the quarter-wave plate 114 and retroreflector 122. In this embodiment each of the components is aligned with and intersected by the optical axis 100. In this embodiment, the translation axis 190 is generally orthogonal to and intersects with the optical axis 100, though this need not be the case.

The maximum angle of the etalon wedge formed by the first and second reflectors 116–118, i.e. the tuning angle, is set by the requirement that the center shift over one beam diameter should be less than the etalon/filter full width at half max (fwhm).

The corrective element 120 is, in this embodiment of the invention, fabricated from an optical element having a uniform index of refraction. The corrective element has a wedge-shaped profile with exterior and interior generally planar surfaces which converge at a corrective angle 202. In the embodiment shown, both the corrective element 120 and the air gap etalon 162 are coupled to mount 142, which is in turn coupled to translator 144. The translator 144 is affixed to the base 138 (See FIG. 1A). The translator is coupled to and controlled by the tuner 160. The tuner may include feedback elements, such as sensors, to monitor laser operating parameters, e.g. wavelength of the laser. In an embodiment of the invention in which the translator is a piezo electric element, the tuner would provide the electrical impulse to control the expansion and contraction of the piezo element along the translation axis 190. This would have the effect of translating both the air-gap etalon and the corrective element synchronously across the optical axis.

In FIG. 2A, the combined etalon and corrective element assembly is shown at a retracted position 204 and an extended position 206, linearly displaced from one another along the translation axis 190. FIG. 2B provides an exploded cross-sectional view of the paths 224–226 and 220–222 of the beam 124 at each of these positions through both the air-gap etalon 162 and the corrective element 120. In the retracted position 204 the beam traverses relatively thicker portions 224–226 of respectively the air-gap etalon and the corrective element. In the extended position 206 the beam traverses relatively thinner portions 220–222 of respectively the air-gap etalon and the corrective element. Thus, in the extended position of the etalon and corrective element, the etalon supports shorter wavelengths at which constructive interference takes place between the reflective surfaces of the etalon or higher frequencies of lasing. In the retracted position, the etalon supports longer wavelengths and lower frequencies of lasing at which constructive interference takes place. The required relationship between the change in the etalon gap "G" and the change in the optical path length "P" is $$\frac{dP}{P} = \frac{dG}{G}.$$

Absent the corrective element 120, the translational tuning of the air-gap etalon would result in mode-hopping since both the optical and actual length of the external cavity would be constant. The optical length "P of a cavity is the sum of the product of refractive index "n" and thickness "L" along the optical axis of each of the elements "i" through which the beam passes. More specifically, the optical length of the external cavity is the sum of each of these products or $$P = \sum n_i \cdot L_i.$$

In the embodiment shown in FIG. 2A, the corrective element 120 is a material fabricated from a substrate with a uniform index of refraction which varies in thickness and is affixed to and actuated by the same translator 144 which positions the etalon 162. Thus, the translation of the corrective element 120 provides a variation in the average index of refraction of the optical path. By synchronizing the etalon and corrective element, the average index of refraction along the beam path varies directly with the tuned wavelength thus maintaining the same integer number of half-wavelengths in the external cavity and avoiding mode-hopping.

In addition to the above discussed mechanisms for providing cavity tuning by etalon translation and optical path correction, the embodiment of the invention shown in FIGS. 1–2 also diminishes the amount of spurious reflections 214 which are fed back into the laser amplifier 102. These spurious reflections arise when the laser beam strikes the first reflector 116. In the embodiment shown in FIGS. 1–2, the normals to either the first and second reflectors lie within the Z-Y reference plane. Because of the narrow wedge (aka tuning) angle between the reflectors, the beam intersects each of the reflectors substantially orthogonally. This results in out-of-band, unfiltered spurious reflections and spurious interference being fed back directly to the gain medium (see FIG. 2 reference 214, 210). This unwanted feedback is detrimental to the operation of the laser.

The quarter-wave plates 112–114 reduce the feedback from spurious reflections 214. The filter/etalon 162 operates in double-pass transmission for feeding back narrow band light to the gain medium. A high finesse interference filter/etalon has sharp transmission peaks. Light which is not transmitted by the filter/etalon 162 is reflected back toward the gain medium. This embodiment of the invention makes use of the fact that the gain medium preferentially amplifies substantially linearly polarized light, along with the polarization transforming properties of quarter-wave plates. The filtered light passes twice through both quarter-wave plate 112 and quarter-wave plate 114 and thus returns to the gain medium with the same polarization as it started with. The reflected light 214 passes twice through only quarter-wave plate 112 and thus returns to the gain medium with the orthogonal polarization it started with and thus is not amplified by the gain medium. Further teachings on the functioning of quarter-wave plates are found in R. C. Jones "*A New Calculus for the Treatment of Optical Systems*" Journal of the Optical Society of America, Volume 31, Page 488–493, July 1941 which is incorporated by reference as if fully set forth herein.

Figure 2D:
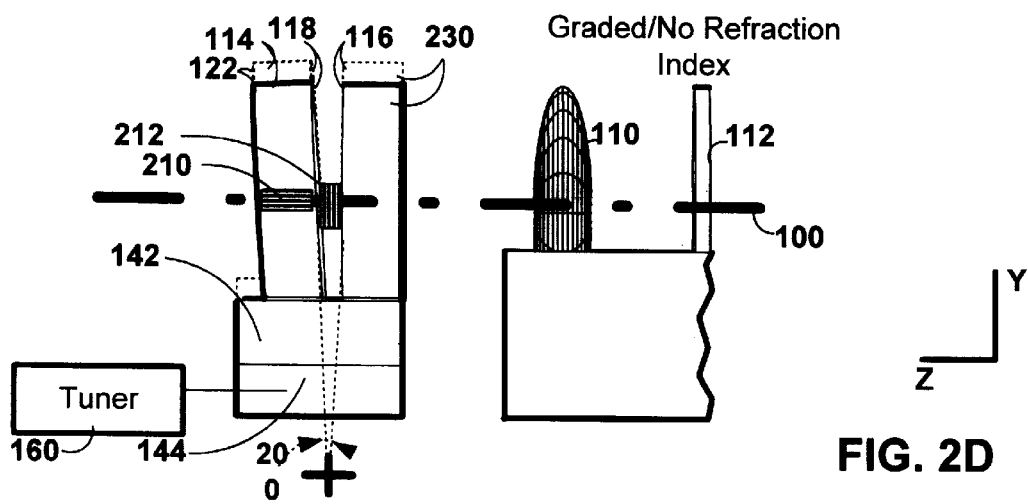

FIGS. 2C–D show alternate embodiments of the etalon and corrective element which retain each of the above discussed features including translational tuning, as well as suppression of both mode-hopping and spurious reflections.

In the first of these embodiments shown in FIG. 2C, the second reflector of the air-gap etalon is affixed directly to the interior face of the quarter-wave plate 122 and the retroreflector 122 has been affixed directly to an exterior face of the quarter-wave plate 122. The entire assembly including the associated wedge-shaped corrective element 120 is coupled via mount 142 and translator 144 to base 138 (not shown). These components are moved by the translator along the translation axis 190 (see FIG. 2A) with the same effects in terms of tuning and adjustment of the index of refraction of the external cavity to maintain an integer number of wavelength in the cavity as has been described and discussed above in connection with FIG. 2A. Additionally, the quarter-wave plates have a similar effect to that described and discussed above as well, i.e., suppressing spurious reflection of the beam from the first reflector 116.

In another embodiment of the invention shown in FIG. 2D, many of the features shown in FIG. 2B, including the combination of the retroreflector 122 with the quarter-wave plate 114 and second reflector 118, are retained. In this embodiment of the invention, the corrective element 230 is a substrate of uniform thickness but having an index of refraction grated along the translation axis. The grated index of refraction can be realized by various vacuum dopant diffusion techniques which increase the refractive index along the translation axis. The corrective element 230 is coupled via mount 142 and translator 144 to the base. As the translator extends and retracts the air gap, it also extends and retracts the corrective element across the optical path 100. This has the effect of causing the beam to intersect cross-sectional portions of the corrective element which have greater or lesser indices of refraction thus effecting the overall optical path length of the cavity. As discussed above the quarter-wave plates 112–114 provide for the suppression of spurious reflections of the beam off the first reflector 116.

Figure 2E:
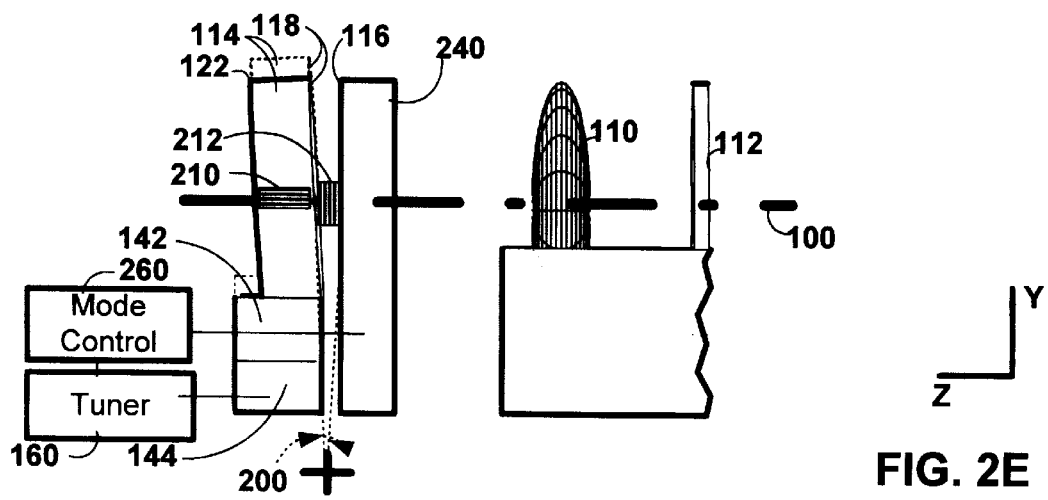

FIG. 2E shows an alternate embodiment of the invention in which both the corrective element and the first reflector 116 of the etalon are stationary. In this embodiment, only the assembly comprising the second reflector 118 of the etalon, the quarter-wave plate 144 and the retroreflector 122, are subject to translation along the translation axis 190 (see FIG. 2A) by means of the translator 144. The opposing first and second reflectors 116–118 maintain similar angular relationship, i.e., tuning angle 200, to that described and discussed above in connection with FIGS. 2A–D. The second reflector 118 is a generally planar surface intersected by the optical axis 100. The translation of the second reflector 118 along the translation axis results in a variation of the thickness of the air gap between the reflectors relative to the optical axis. This allows for the above-discussed tuning of the external cavity. Additionally, the corrective element 240 is fixed. In this embodiment the corrective element is fabricated from a material in which the refractive index can be varied by means of an electrical stimulus provided by a mode controller 260. The mode controller is coupled both to the corrective element 240 as well as to the tuner 160. The tuner extends and retracts the second reflector 116 of the etalon to increase or decrease the frequency at which the external cavity lases. Concurrently, the mode controller applies the appropriate electrical energy to the corrective element 240 so as to increase or decrease the refractive index of the element to vary the optical path length of the cavity so as to suppress mode-hopping during tuning of the laser.

Figure 3B:
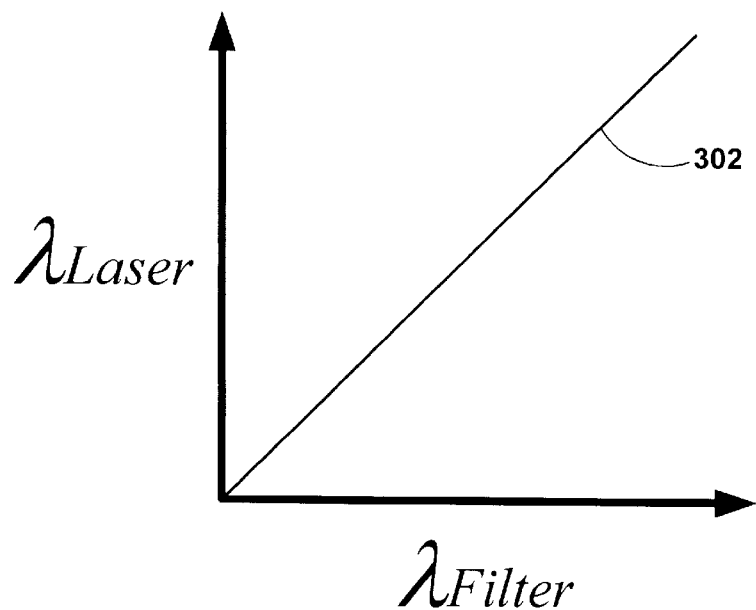
FIGS. 3A–3B are graphs which show respectively mode-hopping and phase continuous tuning of the external cavity laser shown in the accompanying figures.
Figure 3A:
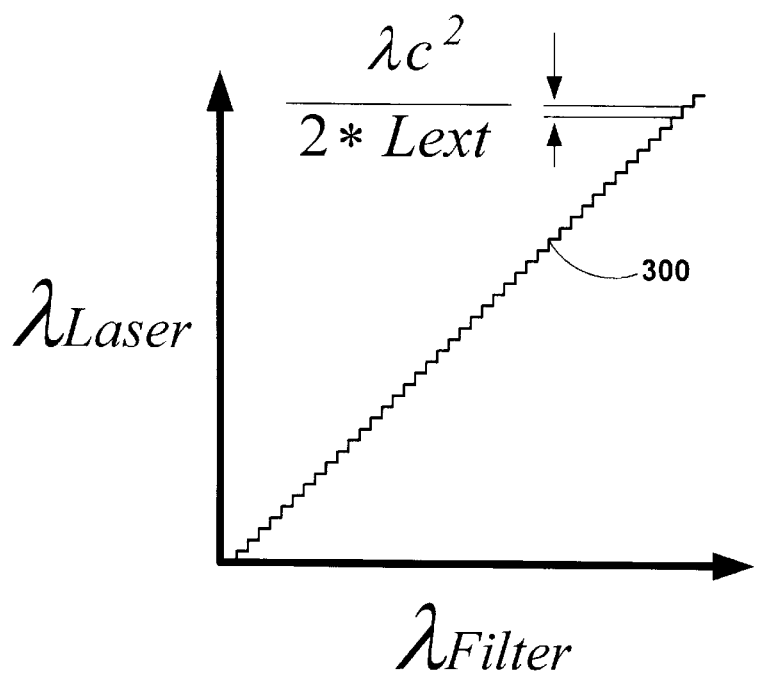

FIGS. 3A–B are graphs showing the operation of the tunable laser shown in FIGS. 1A–B and 2A–E, respectively, with and without the corrective element 120 (see also FIGS. 2C–E reference numbers 230 and 240).

The wavelengths of the longitudinal modes of the laser cavity are related to the cavity length by $$L_{ext} \approx m \cdot \frac{\lambda_m}{2}$$

where m is an integer referred to as the mode number. Typically $m > 10^3$. The laser may only oscillate at wavelengths which are longitudinal modes. The size of the mode-hops is approximately $$\frac{\lambda_c^2}{2L_{ext}}$$

where $\lambda_c$ is the center of the tuning range. Therefore, if the cavity length remains constant as the filter/etalon peak is tuned, the laser output will change discontinuously, giving rise to a tuning characteristic known as mode-hop tuning (See FIG. 3A).

As shown in FIG. 3A, the tuning of a cavity without a corrective element involves a change in wavelength and in the integer number of half-wavelengths in the tuning cavity over the entire operating range. This in turn produces the discontinuous plot 300 of laser wavelength versus the feedback wavelength generated by the etalon/filter.

If, on the other hand, cavity length can be varied so that $$L_{ext} = M \cdot \frac{\lambda}{2}$$

for a fixed integer M, as the laser wavelength $\lambda$ is varied, then the laser will always oscillate at the same mode number. In other words, there will be no mode-hops and the laser wavelength will track the filter wavelength in continuous fashion. This type of tuning is called mode-hop-free or phase-continuous tuning and is illustrated in FIG. 3B. To ensure single-longitudinal-mode operation with a high sidemode suppression ratio, the filter must create a differential loss between the lasing mode and the neighboring longitudinal modes. Lasing will occur at the peak of the net gain. Sidemode rejection depends on the full width at half-maximum (fwhm) of the filter loss profile compared to $$\frac{c}{L_{ext}}$$

where $L_{ext}$ is the length of the external cavity. The ideal, though not necessary condition is that $$fwhm \approx \frac{c}{L_{ext}}.$$

This condition can be approached with interference filter/etalon based technology.

As shown in FIG. 3B, the plot 302 of lasing wavelength versus the wavelength tuned for by the etalon/filter is substantially continuous, i.e., without discontinuities resulting from mode-hopping. This phase continuous tuning is achieved by a corrective element which in any of the embodiments shown in FIGS. 2A–E and elsewhere has the property of increasing the optical length of the cavity as the wavelength to which the cavity is tuned increases.

FIGS. 4A–B show an alternate embodiment of the invention which allows for suppression of both spurious reflections and spurious interference without the use of intracavity wave plates. FIG. 4A is an isometric side view of the tuning and corrective element portion of the laser while FIG. 4B is a top view. The laser includes a lens system 440 which focuses the waist region of the laser beam on the etalon so that it is elongated on a major axis and compressed along a minor axis resulting in a substantially elliptical cross-sectional profile 410. The major and minor axes along which the expansion and compression of the beam takes place lie in a plane parallel to the X-Y plane. The minor axis along which the beam is compressed is substantially collinear with the above-discussed translation axis 190 along which the wedge-shaped etalon is translated. The wedge or tuning angle 200 lies substantially with the Z-Y plane.

As shown in FIG. 4B the entire tuning and correction assembly comprising in this embodiment the translator 144, mount 142, etalon 162, corrective element 120, and substrate 130, is displaced arcuately about the translation axis by a tilt angle 402. This angulation, on the order of 6 degrees, is sufficient to cause spurious reflections 214 to vector away from the optical axis 100. Additionally, this embodiment provides for the spurious interference 210 to be directed away from the optical axis. This results in a higher fidelity of the tuning of the laser as well as the elimination of quarter-wave plates or their equivalent.

FIGS. 5–7 show alternate embodiments of the anamorphic/astigmatic lens system 440. FIGS. 5A–B are isometric and top views of an embodiment of the astigmatic/anamorphic lens system 440. In this embodiment the laser diode 102 is fabricated with a wave guide which produces a highly elliptical output beam 126. Lenses 108–110 serve respectively to collimate and focus the elliptical beam 126 into an elliptical cross-sectional profile 410, the waist region of which falls within the etalon 162. The compression of the beam along both the Y and the translation axis 190 improves the precision with which the etalon is capable of tuning the laser. The expansion of the beam along the X axis increases walk-off loss in the spurious interference 210 produced between the second reflector 118 of the etalon and the retroreflector 122. This improves the operating characteristics of the laser by reducing the feedback to the gain medium from the spurious interference.

Figure 6B:
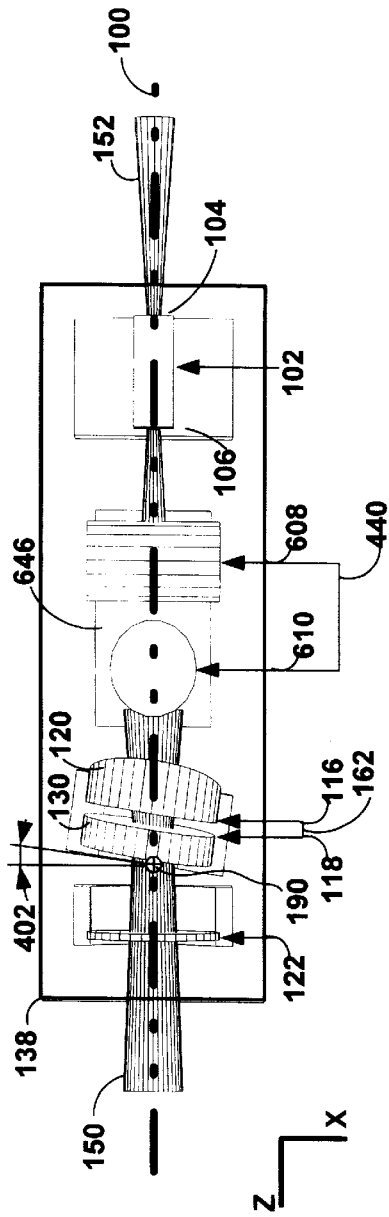
FIGS. 6A–6B are respectively detailed isometric and top views of an external cavity diode laser incorporating another embodiment of a lens system suitable for use with the novel etalon and corrective elements shown in FIGS. 4A–B.
Figure 6A:
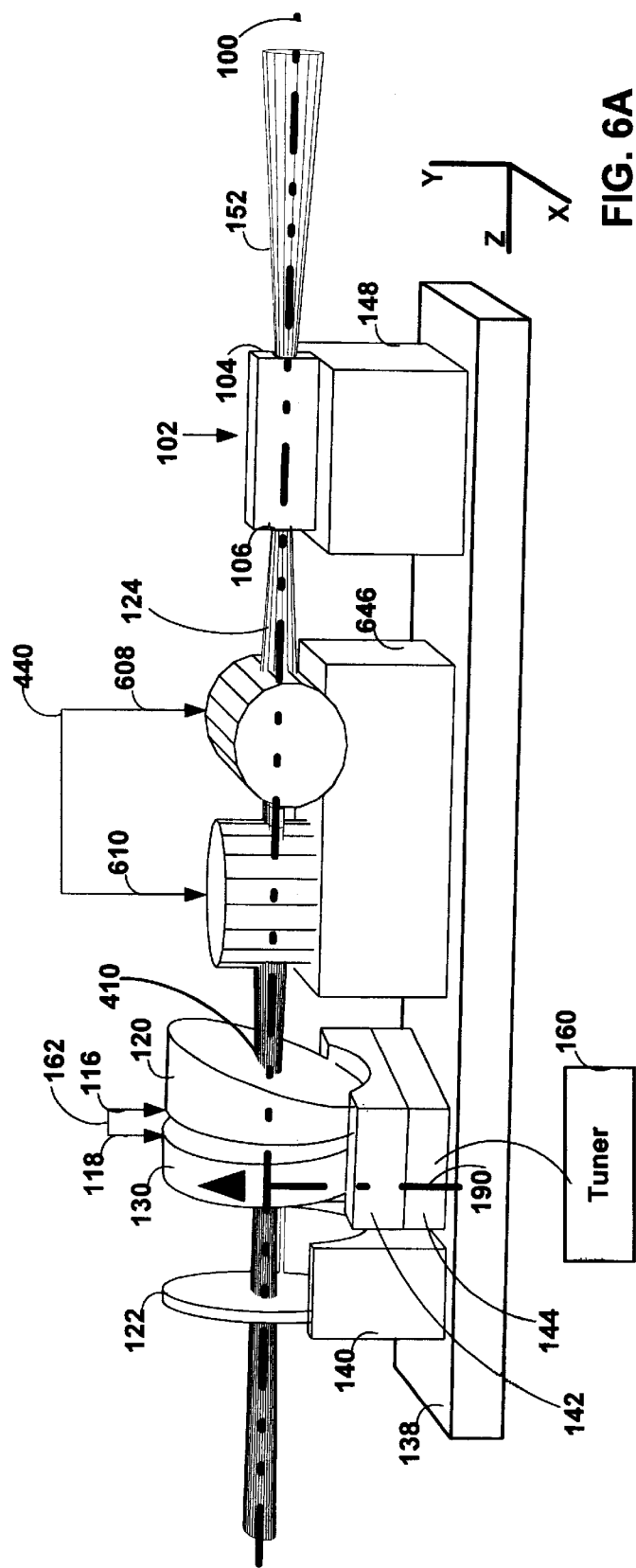

FIGS. 6A–B are isometric and top views of an alternate embodiment of the astigmatic/anamorphic lens system 440. In the embodiment shown in FIG. 6A the astigmatic lens system distorts the beam 124 along both the X and Y axis. Along the Y axis the beam is compressed. Along the X axis the beam is expanded. This produces the desired elliptical cross section 410 with a waist region of the beam having an elliptical cross-section within the etalon 162. The astigmatic lens system 440 comprises two cylindrical lenses 608–610 positioned between the front facet of the laser 106 and the corrective element 120. Longitudinal axis of each of these cylindrical lenses are orthogonal one to the other.

FIGS. 7A–B are respectively isometric side and top views of another embodiment of the anamorphic/astigmatic lens system 440. In this embodiment, anamorphic prisms 708–710 and focusing lens 706 compress the beam 124 along an axis (i.e., the Y axis) so that it achieves the desired elliptical profile 410 and its waist region is located within the etalon 162.

Each of the arrangements described and discussed above shows, for purposes of clarity of exposure, a translation axis which is generally parallel with the Y axis of reference. This need not however be the case. In alternate embodiments, the translation axis may not be parallel with the Y axis, provided only that the appropriate displacement of either of the first or second reflectors can be provided for the tuning of the cavity.

The foregoing description of a preferred embodiment of the invention has been presented for purposes of illustration and description. It is not intended to be exhaustive or to limit the invention to the precise forms disclosed. Obviously many modifications and variations will be apparent to practitioners skilled in this art. It is intended that the scope of the invention be defined by the following claims and their equivalents.

What is claimed is:

1. A tunable external cavity laser comprising:
    a laser amplifier for emitting a beam;
    a retroreflector in a path of the beam;
    a first reflector and a second reflector positioned opposite one another and in the path of the beam between the laser amplifier and the retroreflector; and
    a translator for translating at least one of said first reflector and said second reflector to vary a separation between the reflectors along the path of the beam, thereby tuning the laser amplifier.

2. The tunable external cavity laser of claim 1, wherein said first and said second reflectors are angularly coupled to one another; and wherein the translator for translating both said first and second reflectors across the path of the beam.

3. The tunable external cavity laser of claim 2, wherein said first and second reflectors define between them a wedge shaped gap.

4. The tunable external cavity laser of claim 2, further comprising:
    a wedge shaped substrate; and
    wherein said first and second reflectors include reflective layers affixed to said wedge shaped substrate.

5. The tunable external cavity laser of claim 1, further comprising:
    a corrective element positioned in the path of the beam between the laser amplifier and the retroreflector for varying the optical length of the cavity to suppress mode hopping during tuning of the laser amplifier.

6. The tunable external cavity laser of claim 5, wherein the corrective element further comprises:
    a substrate including a uniform index of refraction and a linearly varying thickness defined along axes parallel to the path of the beam, and the substrate coupled to the translator for translation across the path of the beam to suppress mode hopping during tuning of the laser amplifier.

7. The tunable external cavity laser of claim 5, wherein the corrective element further comprises:
    a substrate including a grated index of refraction defined along a translation axis across the path of the beam, and the substrate coupled to the translator for translation across the path of the beam to suppress mode hopping during tuning of the laser amplifier.

8. The tunable external cavity laser of claim 5, wherein the corrective element further comprises:
    a substrate including a index of refraction varying in response to an electrical stimulus; and
    a mode control coupled to the substrate to provide the electrical stimulus to suppress mode hopping during tuning of the laser amplifier.

9. The tunable external cavity laser of claim 1, further comprising:
    a pair of quarter-wave plates, and a first of the pair of quarter-wave plates positioned in the path of the beam, between the retroreflector and the reflectors; and a second of the pair of quarter-wave plates positioned in the path of the beam between the reflectors and the laser amplifier, and the pair of quarter-wave plates for reducing spurious reflections of the beam.

10. The tunable external cavity laser of claim 1, wherein said laser amplifier comprises a laser diode.

11. The tunable external cavity laser of claim 1,
    wherein said laser amplifier provides the beam with a cross-section compressed along a translation axis defined at an angle to the path of the beam;

wherein said translator translates at least one of said first reflector and said second reflector along the translation axis; and wherein further said first and said second reflectors are positioned to intersect the path of the beam at a tilt angle defined arcuately about the translation axis, thereby reducing spurious interference and reflections of the beam.

12. The tunable external cavity laser of claim 1, further comprising:

a lens system positioned between the laser amplifier and said first and said second reflectors for compressing the beam along a translation axis defined at an angle to the path of the beam;

wherein said translator translates at least one of said first reflector and said second reflector along the translation axis; and wherein further said first and said second reflectors are positioned to intersect the path of the beam at a tilt angle defined arcuately about the translation axis, thereby reducing spurious interference and reflections of the beam.

13. The tunable external cavity laser of claim 12, wherein said lens system further comprises:

a first cylindrical lens positioned in the path of the beam between the laser amplifier and said first and second reflectors, to compress the beam along the translation axis.

14. The tunable external cavity laser of claim 12, wherein said lens system further comprises:

a pair of cylindrical lenses positioned in the path of the beam between said laser amplifier and the first cylindrical lens and said first and second reflectors, to compress the beam along the translation axis, and to expand the beam along an axis orthogonal to the translation axis.

15. The tunable external cavity laser of claim 12, wherein said lens system further comprises:

a first prism positioned in the path of the beam between the laser amplifier and said first and second reflectors, to compress the beam along the translation axis.

16. The tunable external cavity laser of claim 12, wherein said lens system further comprises:

a pair of prisms positioned in the path of the beam between said laser amplifier and said first and second reflectors, to compress the beam along the translation axis, and to expand the beam along an axis orthogonal to the translation axis.

17. A method of adjusting the wavelength in an optical device including a laser amplifier, a retroreflector and an etalon and the etalon including a first and a second reflective surface; and the method of adjusting the wavelength comprising the act of:

translating at least one of the first and the second reflective surfaces to vary a separation between the reflectors along the path of a beam emitted by the laser amplifier thereby varying a wavelength at which constructive interference between the reflective surfaces takes place.

18. The method of claim 17, further comprising the act of:

varying the optical length of the cavity to suppress mode hopping during tuning of the laser amplifier.

19. The method of claim 17, wherein the translating act further comprises the act of:

translating said at least one of the first and the second reflective surfaces along a translation axis defined at an angle to the path of the beam.

20. The method of claim 19, further comprising the acts of:

compressing the beam along the translation axis; and tilting the first and the second reflectors at a tilt angle defined arcuately about the translation axis, thereby reducing spurious interference and reflections of the beam.

* * * * *